United States Patent
Borel et al.

(10) Patent No.: US 11,557,550 B2
(45) Date of Patent: Jan. 17, 2023

(54) ELECTRONIC CHIP, THE REAR FACE OF WHICH IS PROTECTED BY AN IMPROVED EMBRITTLEMENT STRUCTURE

(71) Applicant: COMMISSARIAT A L'ENERGIE ATOMIQUE ET AUX ENERGIES ALTERNATIVES, Paris (FR)

(72) Inventors: Stephan Borel, Crolles (FR); Lucas Duperrex, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/964,441

(22) PCT Filed: Jan. 23, 2019

(86) PCT No.: PCT/FR2019/050149
§ 371 (c)(1),
(2) Date: Jul. 23, 2020

(87) PCT Pub. No.: WO2019/145640
PCT Pub. Date: Aug. 1, 2019

(65) Prior Publication Data
US 2021/0050310 A1 Feb. 18, 2021

(30) Foreign Application Priority Data
Jan. 25, 2018 (FR) ...................................... 18 50603

(51) Int. Cl.
*H01L 23/00* (2006.01)
*H01L 21/768* (2006.01)
(Continued)

(52) U.S. Cl.
CPC ....... *H01L 23/573* (2013.01); *G01N 21/9505* (2013.01); *H01L 21/76802* (2013.01); *H01L 23/481* (2013.01)

(58) Field of Classification Search
CPC .................. H01L 23/573; H01L 21/76802
See application file for complete search history.

(56) References Cited

U.S. PATENT DOCUMENTS

| | | | |
|---|---|---|---|
| 2010/0110607 A1* | 5/2010 | DeNatale | H01L 28/90 257/E21.011 |
| 2010/0181645 A1* | 7/2010 | Marenco | H01L 27/0805 257/532 |

(Continued)

FOREIGN PATENT DOCUMENTS

| EP | 1 127 387 A1 | 8/2001 |
|---|---|---|
| EP | 2 866 259 A1 | 4/2015 |
| EP | 3 086 368 A2 | 10/2016 |

OTHER PUBLICATIONS

U.S. Appl. No. 16/254,846, filed Jan. 23, 2019, US 2019/0229073 A1, Stephan Borel et al.

(Continued)

*Primary Examiner* — Herve-Louis Y Assouman
(74) *Attorney, Agent, or Firm* — Oblon, McClelland, Maier & Neustadt, L.L.P.

(57) ABSTRACT

An electronic chip includes at least an electronic circuit disposed on a front face of a substrate; and an embrittlement structure comprising at least blind holes, each extending through a rear face of the substrate and a portion of the thickness of the substrate and each having a section, in a plane parallel to the rear face of the substrate, of surface area S and having a closed outer contour, the shape of which includes at least one radius of curvature R, such that $S > \pi \cdot R^2$.

12 Claims, 2 Drawing Sheets

(51) Int. Cl.
*H01L 23/48* (2006.01)
*G01N 21/95* (2006.01)

(56) References Cited

U.S. PATENT DOCUMENTS

2013/0313718 A1* 11/2013 Varghese ............... H01L 22/12
 257/774
2015/0108606 A1* 4/2015 Lamy ................... H01L 23/481
 257/532

OTHER PUBLICATIONS

International Search Report dated Jun. 11, 2019 in PCT/FR2019/050149 filed on Jan. 23, 2019, citing documents AA, AO, and AP therein, 2 pages.
Preliminary French Search Report dated Oct. 31, 2018 in French Application No. 1850603 filed on Jan. 25, 2018.

* cited by examiner

ELECTRONIC CHIP, THE REAR FACE OF WHICH IS PROTECTED BY AN IMPROVED EMBRITTLEMENT STRUCTURE

TECHNICAL FIELD AND PRIOR ART

The invention relates to the protection of electronic chips, and relates to an electronic chip including in particular means protecting the rear face of the electronic chip and suitable for preventing access to the electronic circuit of the chip via the rear face thereof. The invention is applicable to any type of electronic chip: mobile telephone, bank card, health card, identity document chip, etc.

The attacks to which an electronic chip can be subjected are generally aimed at accessing confidential data stored in the electronic circuit of the chip in order to clone same, modify the information stored, steal the identity of the owner thereof, etc. An electronic chip can be attacked in multiple ways: chemical, physical, laser, electromagnetic, electrical, software, etc.

On a so-called "secure" electronic chip, the front face, i.e. the chip face on the side whereof the electronic circuit is located, is generally protected by multiple means.

The protection elements of the front face of the chip can be used to prevent access to the sensitive zones of the electronic circuit. For example, a metallic layer disposed at the front face of the chip can form an opaque screen to infrared rays and thus prevent injection flaw attacks carried out using an infrared laser. Furthermore, a metallic track disposed at the front face of the electronic chip can be used to prevent an attacker from placing test probes on sensitive information transit or storage zones in order to read the content thereof.

The protection elements of the front face of the chip can also be used to detect and inform the electronic circuit of the chip of an attack or an attempted attack in order to trigger a reaction making it possible to protect the desired data. For example, a photodiode can make it possible, by means of a light intensity measurement, to detect the use of a laser for the purposes of injecting flaws into the electronic circuit of the chip.

On the other hand, the rear face of the electronic chip is generally not as well protected and therefore represents a first-line access route to the front face. Without protection means of this rear face, there is nothing blocking the execution of a thinning of the chip substrate via the rear face thereof, or the creation of electronic malfunctions with an infrared laser ("glitches"), the silicon (which is the material generally used) of the substrate being transparent to characteristic infrared wavelengths. The access to the electronic circuit of the chip obtained then makes it possible to carry out for example a reading of the data by obtaining the encryption key used in the circuit.

To protect the rear face of a chip, it is possible for example to produce a reflector on the rear face which, coupled with a transmitter/receiver disposed on the front face, makes it possible to verify the integrity of the rear face as in the case of a thinning attack, this reflector is then degraded. It is also possible to produce a 3D capacitor suitable, by measuring the capacitance with the substrate, for detecting a thinning of the chip via the rear face thereof.

The document EP 3 086 368 A2 proposes a solution for protecting the rear face of a chip comprising several elements:
an embrittlement structure formed of blind holes suitable for embrittling the chip in the event of thinning thereof via the rear face thereof and, when the walls of the blind holes are coated with a metallic film, forming a 3D protective screen;
a resistive element forming a metallic coil covering the rear face of the chip and the integrity whereof can be verified by measuring the resistance thereof; and
an encapsulation by an infrared-opaque polymer, resistant to FIB (focused ion beam) and more resistant to chemical etching agents ($HNO_3$ in particular) than the polymer disposed under the metallic coil.

The blind holes and the electrically conductive vias, or TSV ("Through Silicon Via"), electrically connecting the resistive element (on the rear face) to the electronic circuit (on the front face) are produced during the same etching step for cost reasons. A difference in depth between the electrically conductive vias and the blind holes is obtained using the ARDE ("Aspect Ratio Dependent Etching") phenomenon whereby a greater etching depth is obtained for the wider patterns during a single etching step. The electrically conductive vias must therefore be produced with a cross-section, in the plane of the rear face of the substrate, of greater dimensions than that of the blind holes.

The blind holes can include different diameters so that they have different depths. Indeed, according to the ARDE phenomenon, a via produced with a circular cross-section of radius R has an opening surface S such that $S=\pi \cdot R^2$ and makes it possible to obtain, for a given etching time, an etching depth P as defined by the curve $P=f(\emptyset)$ shown in FIG. 1, where $\emptyset$ corresponds to the diameter of the circular cross-section of the hole produced.

In a structure, fractures are initiated where stress is concentrated. However, in the embrittlement structure described above, the zones of maximum stress are located at the blind holes of smaller diameter. When the electronic chip includes the embrittlement structure and it is subject to flexural stress, cracks appear precisely at the zones where the maximum stress is located, namely the blind holes of smaller diameter formed in the embrittlement structure. Therefore, it is the blind holes produced with the smallest diameters that contribute the most to the embrittling property of the embrittlement structure. However, during a thinning attack via the rear face of the electronic chip, for example by micro-milling, it is also the blind holes with the smallest diameters, and therefore with the shallowest depths, that are removed first, no longer providing an embrittling effect to the embrittlement structure. The blind holes of greater diameters, and therefore of greater depths, remain present in the substrate, even after substantial thinning, but provide a lesser embrittling effect to the structure.

DESCRIPTION OF THE INVENTION

An aim of the present invention is that of providing an electronic chip comprising a rear face protected by an embrittlement structure which does not have the drawbacks of the prior art, i.e. providing substantial embrittlement and wherein the elements providing this embrittlement are not readily removable.

For this, the invention relates to an electronic chip including at least:
an electronic circuit disposed on the side of a front face of a substrate; and
an embrittlement structure comprising at least blind holes each extending through a rear face of the substrate and a part of the thickness of the substrate and each including a cross-section, in a plane parallel with the rear face of the substrate or at the rear face of the substrate, of surface area S and the shape whereof includes at least one radius of curvature R such that $S > \pi \cdot R^2$, or having a closed outer contour the shape whereof includes at least one radius of curvature R such that $S > \pi \cdot R^2$.

This electronic chip therefore includes an embrittlement structure including blind holes, the pattern whereof, for each blind hole, may comprise at least a low radius of curvature with respect to that of a circle of surface area equal to the surface area of the cross-section of the blind hole. Thus, with respect to a blind hole of circular cross-section which includes, in a plane parallel with the rear face of the substrate, a surface area $S' = \pi \cdot R^2$ the value whereof is solely dependent on the value of the radius of curvature, the blind holes of this embrittlement structure are produced with, in a plane parallel with the rear face of the substrate, patterns such that the value of the surface area of these patterns is not solely dependent on the value of the radius of curvature. By selecting a shape fulfilling the condition $S > \pi \cdot R^2$, it is possible to produce blind holes which, with respect to a blind hole of circular-shaped cross-section with an equivalent radius of curvature R, attain a greater depth in the substrate due to the ARDE phenomenon occurring during the production of the blind holes.

It is therefore possible to select values of the radius of curvature, on which the embrittling property of the embrittlement structure is dependent, and of the surface area, and therefore implicitly of the depth attained, on which the ease of removing the blind holes is dependent, independently of one another. The blind holes may therefore be produced with a cross-section which has, in a plane parallel with the rear face of the substrate, a substantial surface area S to attain a substantial depth in the substrate and a low radius of curvature R to form stress concentration zones and thus obtain an embrittlement structure having a high embrittlement potential.

The fact that the shape includes at least one radius of curvature R such that $S > \pi \cdot R^2$, or having a closed outer contour the shape whereof includes at least one radius of curvature R such that $S > \pi \cdot R^2$, it is possible to adjust the value of the radius of curvature according to the degree of embrittlement sought, i.e. neither too brittle so as not to risk breaking the embrittlement structure when producing the electronic chip, nor not brittle enough to obtain satisfactory protection of the rear face.

Furthermore, this configuration of the embrittlement structure does not modify the primary function thereof, namely forming a protection against a mechanical thinning or a polishing of the electronic chip via the rear face thereof, as well as against an attack by FIB or by chemical etching of the rear face of the electronic chip.

Advantageously, the shape of the cross-section of each of the blind holes, or the shape of the closed outer contour of the cross-section of each of the blind holes, may be such that the value of the ratio $S/(\pi \cdot R^2)$ is greater than or equal to about 50, or between about 20 and 100, or indeed between about 50 and 100, or indeed greater than or equal to 20. By selecting the values of the parameters S and R such that $S/(\pi \cdot R^2) > 20$, a very advantageous configuration is obtained, combining a high embrittlement potential of the blind holes (due to the low radius of curvature R present in the pattern of the contours of the blind holes) and a high resistance to thinning attacks (due to the large surface area S of the cross-sections of the blind holes and therefore the substantial depth attained by the blind holes).

The cross-section of each of the blind holes, or the closed outer contour of the cross-section of each of the blind holes, in the plane parallel with the rear face of the substrate, may be of substantially polygonal (and advantageously square or rectangular) shape with rounded corners of radii of curvature of value R, and/or may be cross-shaped comprising ends and/or junctions of arms of the cross which are rounded and which have radii of curvature of value R.

The blind holes may be such that the surface areas of the cross-sections of said blind holes are different from one another and the radii of curvature included in the shapes of the cross-sections of said blind holes, or in the shapes of the closed outer contours of the cross-sections of said blind holes, are substantially similar to one another. In this configuration, blind holes of different depths are obtained in the substrate by varying the dimensions of the cross-sections of the blind holes, while retaining a high embrittlement potential for each of these blind holes.

Internal walls of the blind holes may be covered with an electrically conductive layer.

The electronic chip may further include:
  at least one resistive element disposed on the side of the rear face of the substrate and plumb with at least a part of the electronic circuit; and
  at least two electrically conductive vias extending through the substrate and extending between the front and rear faces of the substrate, each electrically connected to the electronic circuit and to one of the ends of the resistive element such that the value of the electrical resistance of the resistive element can be measured by the electronic circuit.

Thanks to the presence of the resistive element on the rear face of the electronic chip, if a mechanical thinning or a polishing of the rear face of the electronic chip is carried out, this thinning or this polishing causes the degradation of the resistive element. This degradation of the resistive element is then detected by the electronic circuit of the chip which can, for example, trigger a fault.

The resistive element may include at least one electrically conductive track having at least one coil pattern and/or several alternating, interlocked, wound, or interlaced patterns. Such a configuration of the resistive element can furthermore help prevent an attack consisting of replacing the resistive element by an equivalent electrical resistance in order to access the electronic circuit via the rear face of the electronic chip.

The conductive track(s) of the resistive element may have a width between about 1 μm and 20 μm, and/or portions of the conductive track(s) which are adjacent and parallel may be spaced from one another by a distance between about 1 μm and 20 μm. Such a configuration of the resistive element thus leaves too little space for an attack by an FIB beam without inducing a substantial modification of the value of the electrical resistance of the resistive element.

The invention also relates to a method for producing an electronic chip including at least the execution of the steps of:
  producing an electronic circuit on the side of a front face of a substrate; and
  producing an embrittlement structure comprising at least blind holes each extending through a rear face of the substrate and a part of the thickness of the substrate and each including a cross-section, in a plane parallel with the rear face of the substrate, of surface area S and the shape whereof includes at least one radius of curvature R such that $S > \pi \cdot R^2$, or having a closed outer contour the shape whereof includes at least one radius of curvature R such that $S > \pi \cdot R^2$.

The method may further include the production of a resistive element disposed on the side of the rear face of the substrate and plumb with at least a part of the electronic circuit, and of at least two electrically conductive vias extending through the substrate and extending between the front and rear faces of the substrate, each electrically connected to the electronic circuit and to one of the ends of the resistive element such that the value of the electrical resistance of the resistive element can be measured by the electronic circuit.

The production of the electrically conductive vias and the blind holes may include at least the execution of the following steps:
producing an etching mask on the rear face of the substrate, the pattern whereof defines the cross-sections, in the plane parallel with the rear face of the substrate, of the electrically conductive vias and the blind holes; and
etching through the rear face of the substrate according to the pattern of the etching mask.

For the production of the electrically conductive vias, further steps such as an isolation and a metallisation may be executed.

BRIEF DESCRIPTION OF THE DRAWINGS

The present invention will be understood more clearly on reading the description of embodiment examples given merely by way of indication and in no way limitation with reference to the appended drawings wherein.

Identical, similar, or equivalent parts of the different figures described hereinafter bear the same reference numbers so as to facilitate the transition from one figure to another.

The different parts shown in the figures are not necessarily on a uniform scale, in order to render the figures more readable.

The different possibilities (alternative embodiments and embodiments) should be understood as not being mutually exclusive and can be combined with one another.

DETAILED DESCRIPTION OF SPECIFIC EMBODIMENTS

Figure 1:
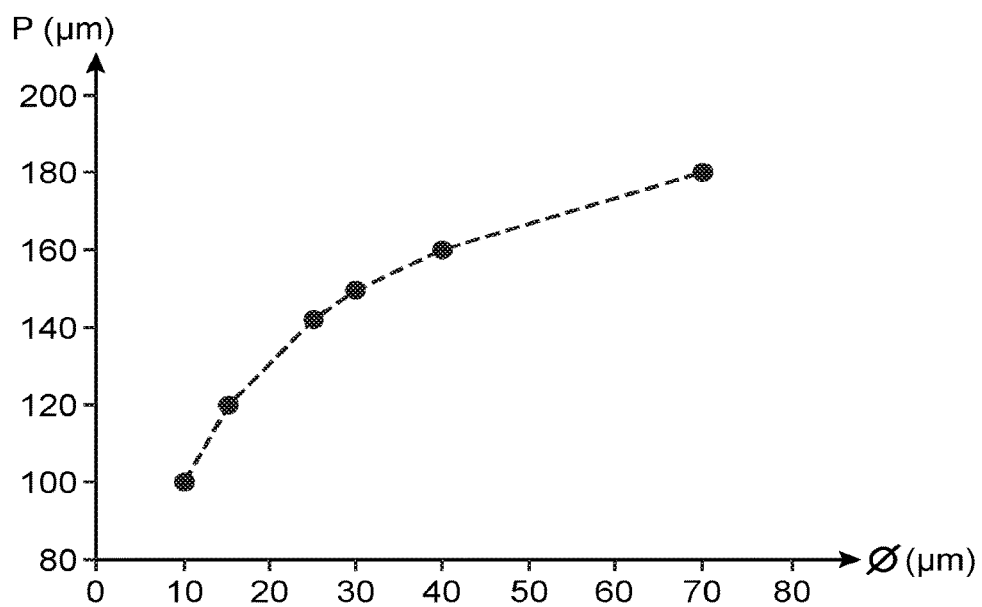
FIG. 1 shows a curve giving, for a given etching time, the etching depth obtained as a function of the diameter of the hole etched in semiconductor.
Figure 2:
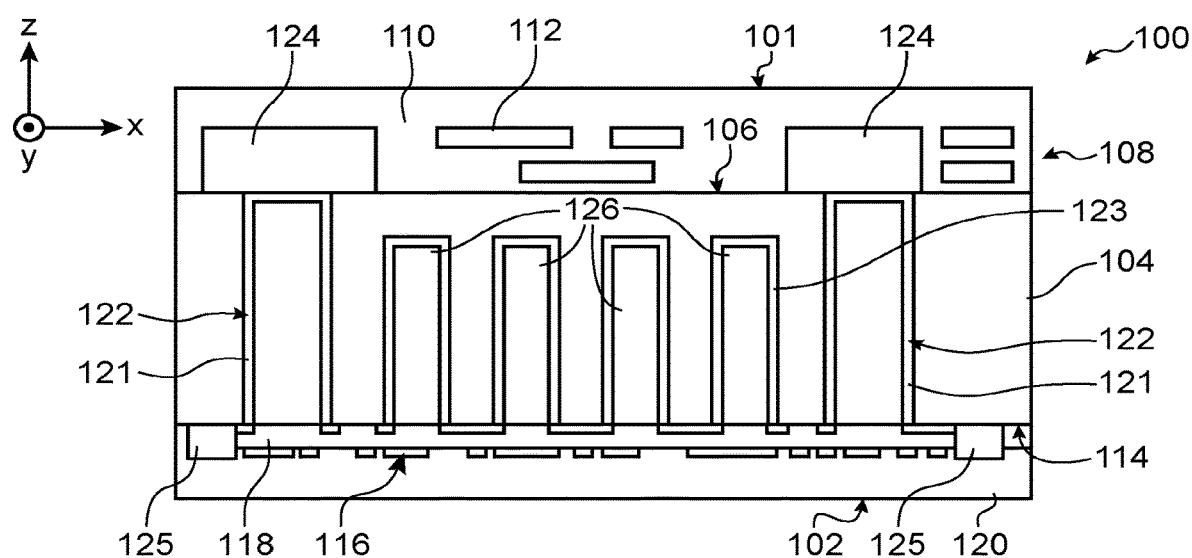
FIG. 2 shows schematically a sectional view of an electronic chip, according to the present invention, according to a specific embodiment.

Reference is firstly made to FIG. 2 which shows schematically a sectional view of an electronic chip 100 including a front face 101 and a protected rear face 102, according to a specific embodiment.

The electronic chip 100 is produced from a substrate 104. The substrate 104 comprises for example a semiconductor material such as silicon. The thickness of the substrate 104 is for example equal to about 180 µm when the electronic chip 100 is intended to be disposed in a chip card. Other types of substrate may be used for producing the electronic chip 100, according to the end use of the electronic chip 100.

The substrate 104 includes a front face 106 whereon an electronic circuit 108 is produced. The electronic circuit 108 includes a stack of layers 110 (dielectric, metallic, semiconductor) forming in particular an active part including electronic components 112 (transistors, memories, etc.) and intended to be protected during any attacks of the electronic chip 100. Although not described herein, the electronic chip 100 may include means protecting the electronic circuit 108 via the front face 101.

The substrate 104 also includes a rear face 114 at the level whereof means for protecting this rear face 114 of the electronic chip 100 are produced.

One of these means of protection is a resistive element 116. This resistive element 116 is disposed plumb with at least a part of the electronic circuit 108, and advantageously plumb with the entire active part of this circuit, on the side of the rear face 114 of the substrate 104.

This resistive element 116 is formed of one or more electrically conductive tracks disposed on a dielectric layer 118 covering the rear face 114 of the substrate 104. The dielectric layer 118 includes for example $SiO_2$ and/or SiN, for example deposited by PECVD (plasma-enhanced chemical vapour deposition) and of thickness between about 1 µm and 10 µm. The dielectric layer 118 may also include at least one polymer material and be deposited by centrifugation or by lamination. The resistive element 116 is for example formed by an ECD (electrochemical deposition) or PVD (physical vapour deposition) deposition of copper and/or aluminium and of thickness for example between about 1 µm and 20 µm, and advantageously between about 1 µm and 10 µm.

The resistive element 116 and the parts of the dielectric layer 118 not covered with the resistive element 116 are covered with a protective layer 120 forming the rear face 102 of the electronic chip 100. This protective layer 120 includes for example an opaque polymer and in particular serves as protection against optical, chemical, or indeed FIB attacks.

The resistive element 116 is herein produced in the form of a coil. The electrically conductive track(s) of the resistive element 116 may have at least one coil pattern and/or several alternating, interlocked, wound, or interlaced patterns, in order to render the resistive element 116 difficult to apprehend, and in particular render the location of the two ends of the resistive element 116 difficult to identify, in the case of an attempted attack on the electronic chip 100 via the rear face 102 thereof.

The ends of the resistive element 116 (two in number in this embodiment example) are each connected electrically to the electronic circuit 108 via an electrically conductive via, or TSV, 122 extending through the entire thickness of the substrate 104 and leading to bump contacts 124 of the electronic circuit 108, as well as by means of electrical interconnections 125 made through the dielectric layer 118. The electrically conductive vias 122 are filled at least partially with an electrically conductive material providing the electrical connection between the ends of the resistive element 116 and the bump contacts 124 of the electronic circuit 108. A layer of electrically conductive material 121 may in particular cover the side walls and the bottom walls of the electrically conductive vias 122, the rest of the volume of the electrically conductive vias 122 optionally being filled with a dielectric material, for example that being used also to form the dielectric layer 118, or indeed remain empty.

During the operation of the electronic chip 100, the value of the electrical resistance of the resistive element 116 is measured between the ends thereof by the electronic circuit

108. If the electronic chip 100 is attacked via the rear face 102 thereof and this attack damages the resistive element 116, the value of the electrical resistance measured by the electronic circuit 108 changes and the latter can then take suitable measures to handle this attack.

A further means of protection of the rear face 102 of the electronic chip 100 is an embrittlement structure comprising blind holes 126 which, unlike the first vias 122, do not extend through the entire thickness of the substrate 104. The blind holes 126 extend through the rear face 114 of the substrate 104 and merely a part of the thickness of the substrate 104. The material depth of the substrate 104 through which the blind holes 126 extend is not similar to that through which the electrically conductive vias 122 pass.

The blind holes 126 each include a cross-section, in a plane parallel with the rear face 114 of the substrate 104, the shape whereof includes a low radius of curvature R, or having a closed outer contour the shape whereof includes a low radius of curvature R. Thanks to this low radius of curvature R, the blind holes 126 are brittle and readily form cracks when the substrate 104 is subject to stress, for example during a thinning attack of the electronic chip 100 via the rear face 102 thereof.

Furthermore, so that these blind holes 126 attain a substantial depth in the substrate 104, or more specifically a depth greater than that obtained by producing, for a given etching time, a blind hole of circular cross-section of radius R, the shape of the cross-section of each blind hole 126, in the plane parallel with the rear face 114 of the substrate 104, is such that the surface area S is greater than the value $\pi \cdot R^2$.

Advantageously, the surface area S of each blind hole 126 is much greater than that of the circular cross-section of radius R, i.e. the shape of the cross-section of each blind hole 126, in the plane parallel with the rear face 114 of the substrate 104, is such that $S \gg \pi \cdot R^2$, which makes it possible to obtain deep and very brittle blind holes 126. This is verified when the shape of the cross-section of each of the blind holes 126 is such that the value of the ratio $S/(\pi \cdot R^2)$ is greater than or equal to about 50, or for example between about 20 and 100, or indeed between about 50 and 100, or indeed greater than or equal to about 20.

The value of the radius of curvature R included in the patterns of the contours of the cross-sections of the blind holes 126 is selected according to the degree of brittleness that the blind holes 126 are intended to provide to the embrittlement structure, and for example between about 1 µm and 10 µm.

Figure 3:
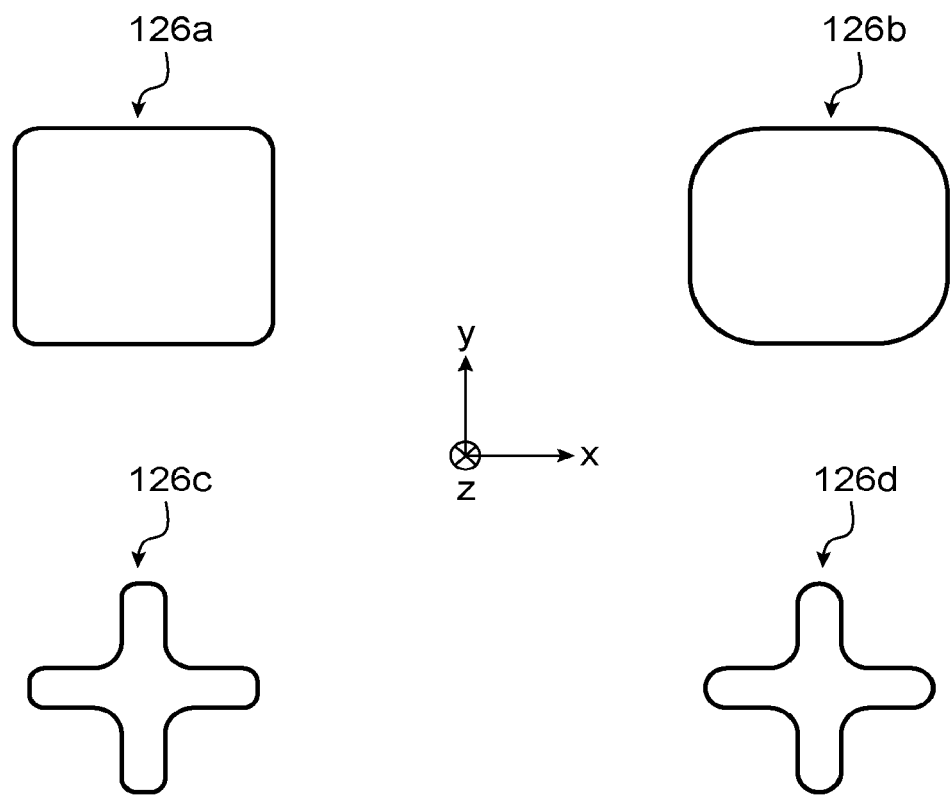
FIG. 3 shows several embodiment examples of blind holes of an embrittlement structure of an electronic chip, according to the present invention.

FIG. 3 shows four embodiment examples of blind holes 126, referenced 126a, 126b, 126c and 126d, the cross-sections whereof, in the plane parallel with the rear face 114 of the substrate 104 (which corresponds to the plane (X,Y) seen in FIG. 3), are such that the pattern thereof includes a radius of curvature R and that the surface area S thereof is such that $S > \pi \cdot R^2$. In this figure, the cross-sections of the blind holes 126a and 126b have a substantially square shape with rounded corners. The radius of curvature R included in the pattern of the closed outer contour of each of these blind holes 126a and 126b is formed by the rounded corners of the cross-sections of these blind holes 126a, 126b. Furthermore, it is seen in this figure that the radius of curvature of the corners of the cross-section of the blind hole 126a is smaller than that of the corners of the cross-section of the blind hole 126b. The embrittlement obtained with the blind hole 126a is greater than that obtained with the blind hole 126b due to this lower radius of curvature inducing greater stress.

In the example in FIG. 3, the cross-sections of the blind holes 126a, 126b have a substantially square shape with rounded corners. More generally, the cross-sections of the blind holes 126a, 126b may have a substantially rectangular shape with rounded corners.

Other blind hole shapes are possible. According to a further example, the blind holes 126c, 126d shown in FIG. 3 have a cross-shaped cross-section, in a plane parallel with the rear face 114 of the substrate 104, comprising ends and/or junctions of the arms of the cross which are rounded (in FIG. 3, the ends and the junctions of the arms of the cross are rounded) and which have radii of curvature of value R and a surface area S is such that $S > \pi \cdot R^2$.

Very numerous other shapes are possible and are not detailed herein. The radii of curvature providing the brittleness may correspond for example to the corners of the cross-section of the blind holes, regardless of the shape and the number of rounded corners of the cross-section of the blind holes.

According to an embodiment example, the blind holes 126 have square-shaped cross-sections with sides of different dimensions from one blind hole to another, and therefore of different surface areas, but with rounded corners all having the same radius of curvature. An embrittlement structure is thus obtained formed by blind holes each providing the same degree of embrittlement (due to the same radius of curvature from one blind hole to another) but having different depths (due to the different surface areas from one section to another).

It is however possible to produce the embrittlement structure with blind holes 126 of the same depth through the substrate 104, as is the case in FIG. 2.

Figure 4:
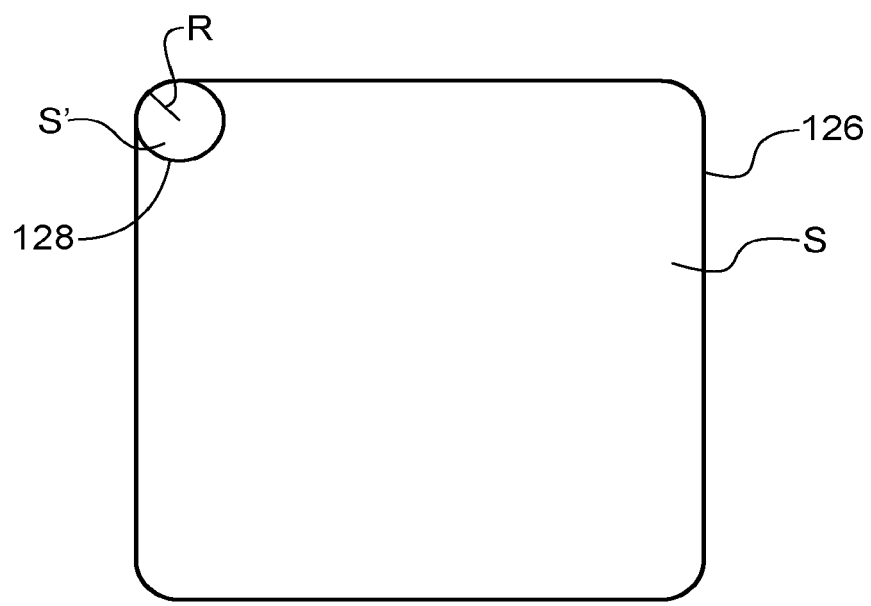
FIG. 4 shows an embodiment example of blind holes of an embrittlement structure of an electronic chip, according to the present invention.

FIG. 4 shows an embodiment example of a blind hole 126 having a surface area S and a square-shaped closed outer contour with rounded corners, i.e. herein four curved parts of the contour each having a radius of curvature R. In FIG. 4, the reference 128 denotes a disk the radius whereof is equal to the radius of curvature R of the corners of the contour of the cross-section of the blind hole 126. The disk 128 has a surface area $S' = \pi \cdot R^2$. FIG. 4 clearly illustrates the fact that the blind hole 126 has a cross-section of surface area $S > S'$, and therefore that $S > \pi \cdot R^2$.

In the electronic chip 100, it is possible that all the blind holes 126 forming the embrittlement structure, or merely some of the blind holes of the embrittlement structure, include a cross-section as described above, i.e. the shape of the outer contour whereof includes at least one radius of curvature R such that $S > \pi \cdot R^2$, where S corresponds to the surface area of the cross-section of the blind hole in a plane parallel with the rear face of the substrate 104.

The blind holes 126 may be filled with a dielectric material, for example a polymer, and is for example similar to that filling the remaining volume of the electrically conductive vias 122 not occupied by electrically conductive material, and for example the same material as that forming the dielectric layer 118.

Advantageously, the electrically conductive material of the layer 121 is also deposited against the side walls and the bottom walls of the blind holes 126. Such an electrically conductive layer bears the reference 123 in FIG. 2. Alternatively, it is possible that the walls of the blind holes 126 be covered with an electrically conductive material other than that used for the metallisation of the electrically conductive vias 122.

When the substrate 104 includes a semiconductor such as silicon, the front and rear faces 106, 114 of the substrate 104 and the side walls of the holes used to produce the electrically conductive vias 122 and optionally those of the blind holes 126 are covered with a dielectric layer so as to electrically isolate the electrically conductive material disposed in these elements facing the semiconductor of the substrate 104.

To produce the electronic chip 100, the following steps are for example carried out:

The components forming the active part of the electronic circuit 108 are first produced at the front face 106 of the substrate 104 via the execution of conventional microelectronic steps. These components are part of the stack of layers 110 which forms the front face 101 of the electronic chip 100. This front face is rigidly connected to a temporary handle formed for example by a semiconductor substrate (for example silicon) or glass, this bonding corresponding for example to an oxide-oxide bonding when the temporary handle includes a semiconductor or to a polymer bonding when the temporary handle includes glass.

The substrate 104 is then thinned via the rear face thereof until the assembly formed of the substrate 104 and the electronic circuit 108 has the desired thickness, for example less than or equal to about 200 μm.

A hard mask, including for example an oxide, is then produced on the rear face 114 of the substrate 104. The pattern of this mask defines the pattern of the holes intended for producing the electrically conductive vias 122 as well as that of the blind holes 126. The holes of the future vias 122 and the blind holes 126 are then formed through the hard mask by deep etching of the material of the substrate 104.

A dielectric layer is then deposited, for example by PECVD or SACVD (sub-atmospheric pressure chemical vapour deposition), such that it covers the hard mask disposed on the rear face 114 of the substrate 102, as well as the side walls and the bottom walls of the holes of the future electrically conductive vias 122 and the blind holes 126. The parts of this dielectric layer deposited on the bottom walls of the holes of the future vias 122 are then removed so that the electrical contacts can be subsequently produced with the contacts 124 by means of the vias 122 through the substrate 104. If the circuit located on the front face 106 requires that the electrically conductive layer located in the blind holes 126 be electrically isolated from the substrate 104, an additional lithography step may be inserted in order to protect the blind holes 126 during the step of etching the isolating layer at the bottom of the electrically conductive vias 122.

The electrically conductive layer forming the conductive material of the vias 122 and that deposited in the blind holes 126 is then produced for example by executing the following steps:

depositing a diffusion barrier layer, including for example a Ti/TiN bilayer (Ti deposited for example by PVD and TiN deposited for example by MOCVD, or metal organic chemical vapour deposition), on the dielectric layer previously deposited as well as at the side walls and the bottom walls of the holes of the vias 122 and the blind holes 126;

depositing a growth layer, including for example copper, on the barrier layer;

lithography of a dry film (positive or negative resin type) so as to define electrical isolation regions between different parts of the electrically conductive layer produced and electrolytic growth, for example copper, from the growth layer in the zones where the latter is devoid of resin patterns; and removing the dry film, then etching the parts of the growth layer and the barrier layer at the isolation regions between the different parts of the electrically conductive layer (in particular between the portions deposited in the vias 122 and those deposited in the blind holes 126).

The dielectric layer 118 is then deposited, for example by vacuum lamination, on the entire rear face of the structure previously obtained, i.e. on and between the portions of electrically conductive material previously produced in the electrically conductive vias 122 and in the blind holes 126. The material of the dielectric layer 118 is for example also deposited such that it fills the remaining empty volumes of the vias 122 and the blind holes 126. Then, the protective layer 118 is etched (or photo-defined if this layer comprises photosensitive material) in order to form openings which will be used to form the electrical interconnections 125 electrically connecting the electrically conductive vias 122 at the ends of the resistive element 116.

The resistive element 116 is then produced by executing the following steps:

depositing a diffusion barrier layer, including for example a Ti/TiN bilayer, on the dielectric layer 118 and in the openings;

depositing a growth layer, including for example copper, on the barrier layer;

lithography of a dry film wherein the pattern (i.e. the locations where the resin is removed) corresponds to the regions occupied by the resistive element 116 and electrolytic growth, for example of copper, from the growth layer; and removing the dry film, then etching the parts of the growth layer and the barrier layer at the regions not occupied by the resistive element 116.

According to a further embodiment, the resistive element 116 may be produced by PVD deposition of an electrically conductive material, followed by a lithography and an etching.

The protective layer 120 is then deposited, for example via the execution of a spin-coating or lamination deposition step, thus encapsulating the resistive element 116 as well as the electrical interconnections 125 and certain parts of the dielectric layer 118.

The temporary handle is then removed.

The invention claimed is:

1. An electronic chip comprising:
   an electronic circuit disposed on a front face of a substrate;
   an embrittlement structure comprising at least blind holes each extending through a rear face of the substrate and a part of a thickness of the substrate and each including a cross-section, in a plane parallel with the rear face of the substrate, of surface area S and having a closed outer contour the shape whereof includes at least one radius of curvature R such that $S > \pi \cdot R^2$,
   at least one resistive element disposed on the rear face of the substrate and plumb with at least a part of the electronic circuit; and
   at least two electrically conductive vias extending through the substrate and extending between the front and rear faces of the substrate, each electrically connected to the electronic circuit and to one of ends of the resistive element such that a value of an electrical resistance of the resistive element can be measured by the electronic circuit.

2. The electronic chip according to claim 1, wherein a shape of the closed outer contour of the cross-section of each of the blind holes is such that a value of a ratio $S/(\pi \cdot R^2)$ is between about 20 and 100.

3. The electronic chip according to claim 1, wherein the closed outer contour of the cross-section of each of the blind holes, in the plane parallel with the rear face of the substrate, is one of a substantially polygonal shape with rounded corners of radii of curvature of value R, and cross-shaped comprising ends and/or junctions of arms of the cross which are rounded and which have radii of curvature of value R.

4. The electronic chip according to claim 1, wherein the blind holes are such that the shapes of the cross-sections of said blind holes are different from one another and that the radii of curvature included in the shapes of the closed outer contours of the cross-sections of said blind holes are substantially similar to one another.

5. The electronic chip according to claim 1, an electrically conductive layer is directly formed on inner walls of the blind holes.

6. The electronic chip according to claim 1, wherein a shape of the closed outer contour of the cross-section of each of the blind holes is such that a value of a ratio $S/(\pi \cdot R^2)$ is greater than or equal to 50.

7. The electronic chip according to claim 1, wherein the resistive element includes at least one electrically conductive track having at least one coil pattern and/or several alternating, interlocked, wound, or interlaced patterns.

8. A method for producing an electronic chip comprising:
producing an electronic circuit on a front face of a substrate;
producing an embrittlement structure comprising at least blind holes each extending through a rear face of the substrate and a part of a thickness of the substrate and each including a cross-section, in a plane parallel with the rear face of the substrate, of surface area S and having a closed outer contour a shape whereof includes at least one radius of curvature R such that $S > \pi \cdot R^2$,
disposing at least one resistive element on the rear face of the substrate and plumb with at least a part of the electronic circuit; and
forming at least two electrically conductive vias extending through the substrate and extending between the front and rear faces of the substrate, each electrically connected to the electronic circuit and to one of ends of the resistive element such that a value of an electrical resistance of the resistive element can be measured by the electronic circuit.

9. The method according to claim 8, further including producing at least two electrically conductive vias extending through the substrate and extending between the front and rear faces of the substrate, each electrically connected to the electronic circuit and to one of ends of the resistive element such that a value of an electrical resistance of the resistive element can be measured by the electronic circuit.

10. The method according to claim 9, wherein producing the electrically conductive vias and the blind holes comprises:
producing an etching mask on the rear face of the substrate, a pattern whereof defines the cross-sections, in the plane parallel with the rear face of the substrate, of the electrically conductive vias and the blind holes; and
etching through the rear face of the substrate according to the pattern of the etching mask.

11. An electronic chip according to claim 1, comprising:
an electronic circuit disposed on a front face of a substrate; and
an embrittlement structure comprising at least blind holes each extending through a rear face of the substrate and a part of a thickness of the substrate and each including a cross-section, in a plane parallel with the rear face of the substrate, of surface area S and having a closed outer contour the shape whereof includes at least one radius of curvature R such that $S > \pi \cdot R^2$,
wherein the blind holes include:
at least one blind hole having a cross-section with a surface area $S_1$ and a first closed outer contour having, in the plane parallel with the rear face of the substrate, a substantially polygonal shape with rounded corners of radii of curvature of value $R_1$ such that $S_1 > \pi \cdot R_1^2$, and
at least one blind hole having a cross-shaped cross-section with a surface area $S_2$ and a second closed contour comprising ends and/or junctions of arms of the cross which are rounded and which have radii of curvature of value $R_2$ such that $S_2 > \pi \cdot R_2^2$.

12. An electronic chip according to claim 1, comprising:
an electronic circuit disposed on a front face of a substrate; and
an embrittlement structure comprising at least blind holes each extending through a rear face of the substrate and a part of a thickness of the substrate and each including a cross-section, in a plane parallel with the rear face of the substrate, of surface area S and having a closed outer contour the shape whereof includes at least one radius of curvature R such that $S > \pi \cdot R^2$, wherein:
each of the blind holes comprises a closed outer contour in the plane having a square cross-section with rounded corners; and
surface areas of the cross-sections of at least two of the blind holes are different from one another;
radii of curvature of the corners are substantially similar to one another; and
depths of the at least two blind holes are different from one another.

* * * * *